US011170834B2

(12) United States Patent
Mutch et al.

(10) Patent No.: US 11,170,834 B2
(45) Date of Patent: Nov. 9, 2021

(54) MEMORY CELLS AND METHODS OF FORMING A CAPACITOR INCLUDING CURRENT LEAKAGE PATHS HAVING DIFFERENT TOTAL RESISTANCES

(71) Applicant: Micron Technology, Inc., Boise, ID (US)

(72) Inventors: Michael Mutch, Meridian, ID (US); Ashonita A. Chavan, Boise, ID (US); Sameer Chhajed, Boise, ID (US); Beth R. Cook, Boise, ID (US); Kamal Kumar Muthukrishnan, Boise, ID (US); Durai Vishak Nirmal Ramaswamy, Boise, ID (US); Lance Williamson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 16/507,826

(22) Filed: Jul. 10, 2019

(65) Prior Publication Data

US 2021/0012824 A1    Jan. 14, 2021

(51) Int. Cl.
  *G11C 11/22* (2006.01)
  *H01L 49/02* (2006.01)
  *H01L 27/11502* (2017.01)
(52) U.S. Cl.
  CPC ...... *G11C 11/221* (2013.01); *H01L 27/11502* (2013.01); *H01L 28/60* (2013.01)
(58) Field of Classification Search
  CPC .. G11C 11/221; H01L 28/60; H01L 27/11502
  See application file for complete search history.

(56) References Cited

U.S. PATENT DOCUMENTS

| 4,070,653 A | 1/1978 | Rao et al. |
| 5,828,092 A | 10/1998 | Tempel |

(Continued)

FOREIGN PATENT DOCUMENTS

| CN | 1490880 | 4/2004 |
| CN | 1505043 | 6/2004 |

(Continued)

OTHER PUBLICATIONS

Nigo et al., "Conduction Band Caused by Oxygen Vacancies in Aluminum Oxide for Resistance Random Acess Memory", Journal of Applied Physics vol. 122, 2012, United States, 6 pages.

(Continued)

*Primary Examiner* — Marcos D. Pizarro
*Assistant Examiner* — Sue Tang
(74) *Attorney, Agent, or Firm* — Wells St. John P.S.

(57) ABSTRACT

A memory cell comprises a capacitor comprising a first capacitor electrode having laterally-spaced walls, a second capacitor electrode comprising a portion above the first capacitor electrode, and capacitor insulator material between the second capacitor electrode and the first capacitor electrode. The capacitor comprises an intrinsic current leakage path from one of the first and second capacitor electrodes to the other through the capacitor insulator material. A parallel current leakage path is between the second capacitor electrode and the first capacitor electrode. The parallel current leakage path is circuit-parallel with the intrinsic current leakage path, of lower total resistance than the intrinsic current leakage path, and comprises leaker material that is everywhere laterally-outward of laterally-innermost surfaces of the laterally-spaced walls of the first capacitor electrode. Other embodiments, including methods, are disclosed.

16 Claims, 10 Drawing Sheets

(56) References Cited

U.S. PATENT DOCUMENTS

| | | | |
|---|---|---|---|
| 5,994,153 A * | 11/1999 | Nagel | H01L 28/55 438/3 |
| 6,144,060 A | 11/2000 | Park et al. | |
| 6,236,076 B1 | 5/2001 | Arita et al. | |
| 6,242,299 B1 | 6/2001 | Hickert | |
| 6,249,014 B1 | 6/2001 | Bailey | |
| 6,256,220 B1 | 7/2001 | Kamp | |
| 6,337,496 B2 | 1/2002 | Jung | |
| 6,339,544 B1 | 1/2002 | Chiang et al. | |
| 6,370,056 B1 | 4/2002 | Chen et al. | |
| 6,611,014 B1 | 8/2003 | Kanaya et al. | |
| 6,635,528 B2 | 10/2003 | Gilbert et al. | |
| 6,674,109 B1 | 1/2004 | Fujimori et al. | |
| 6,717,215 B2 | 4/2004 | Fricke et al. | |
| 6,717,838 B2 | 4/2004 | Hosoi | |
| 6,862,214 B2 | 3/2005 | Lee et al. | |
| 6,876,021 B2 | 4/2005 | Martin et al. | |
| 6,885,048 B2 | 4/2005 | Tarui et al. | |
| 6,940,085 B2 | 9/2005 | Fricke et al. | |
| 7,001,821 B2 | 2/2006 | Aggarwal et al. | |
| 7,180,141 B2 | 2/2007 | Eliason et al. | |
| 7,304,339 B2 | 12/2007 | Chen | |
| 7,378,286 B2 | 5/2008 | Hsu et al. | |
| 7,408,212 B1 | 8/2008 | Luan et al. | |
| 7,525,830 B2 | 4/2009 | Kang | |
| 7,558,097 B2 | 7/2009 | Khellah et al. | |
| 7,573,083 B2 | 8/2009 | Kijima et al. | |
| 7,902,594 B2 | 3/2011 | Mizuki | |
| 8,004,871 B2 | 8/2011 | Kaneko et al. | |
| 8,021,897 B2 | 9/2011 | Sills et al. | |
| 8,026,546 B2 | 9/2011 | Murata et al. | |
| 8,193,522 B2 | 6/2012 | Li | |
| 8,212,256 B2 | 7/2012 | Chen et al. | |
| 8,217,443 B2 | 7/2012 | Izumi | |
| 8,304,823 B2 | 11/2012 | Boescke | |
| 8,399,874 B2 | 3/2013 | Hwang | |
| 8,634,257 B2 | 1/2014 | Hanzawa et al. | |
| 8,796,085 B2 | 8/2014 | Koldiaev | |
| 8,969,170 B2 | 3/2015 | Liebau et al. | |
| 9,159,829 B1 | 10/2015 | Ramaswamy | |
| 9,276,092 B1 | 3/2016 | Karda | |
| 9,305,929 B1 * | 4/2016 | Karda | H01L 28/40 |
| 9,559,118 B2 | 1/2017 | Karda et al. | |
| 9,761,715 B2 | 9/2017 | Ramaswamy et al. | |
| 10,163,917 B2 | 12/2018 | Ramaswamy | |
| 10,396,145 B2 | 8/2019 | Balakrishnan et al. | |
| 2001/0039091 A1 | 11/2001 | Nakagawa | |
| 2001/0040249 A1 | 11/2001 | Jung | |
| 2001/0044205 A1 | 11/2001 | Gilbert et al. | |
| 2002/0036313 A1 | 3/2002 | Yang et al. | |
| 2002/0102808 A1 | 8/2002 | Pu et al. | |
| 2002/0119621 A1 | 8/2002 | Lin | |
| 2002/0125536 A1 | 9/2002 | Iwasa et al. | |
| 2002/0153550 A1 * | 10/2002 | An | H01L 28/57 257/301 |
| 2003/0001189 A1 | 1/2003 | Fujiwara et al. | |
| 2003/0006446 A1 | 1/2003 | Forbes et al. | |
| 2003/0021479 A1 | 1/2003 | Oku | |
| 2003/0063748 A1 | 4/2003 | Shields | |
| 2003/0075753 A1 | 4/2003 | Chu et al. | |
| 2003/0183867 A1 | 10/2003 | Fricke et al. | |
| 2003/0183936 A1 | 10/2003 | Ito et al. | |
| 2004/0002176 A1 | 1/2004 | Xu | |
| 2004/0004240 A1 | 1/2004 | Nishikawa | |
| 2004/0036111 A1 | 2/2004 | Nishikawa et al. | |
| 2004/0070017 A1 | 4/2004 | Yang et al. | |
| 2004/0071022 A1 | 4/2004 | Wald et al. | |
| 2004/0090815 A1 | 5/2004 | Tajiri | |
| 2004/0099893 A1 | 5/2004 | Martin et al. | |
| 2004/0114428 A1 | 6/2004 | Morikawa | |
| 2004/0129961 A1 | 7/2004 | Paz De Araujo et al. | |
| 2004/0173874 A1 | 9/2004 | Saigoh | |
| 2004/0228172 A1 | 11/2004 | Rinerson et al. | |
| 2004/0266045 A1 | 12/2004 | Mears et al. | |
| 2005/0051822 A1 | 3/2005 | Manning | |
| 2005/0101034 A1 | 5/2005 | Aggarwal et al. | |
| 2005/0101086 A1 | 5/2005 | Rinerson et al. | |
| 2005/0167787 A1 | 8/2005 | Fricke et al. | |
| 2005/0237779 A1 | 10/2005 | Kang | |
| 2005/0282296 A1 | 12/2005 | Hsu et al. | |
| 2006/0014307 A1 | 1/2006 | Kweon | |
| 2006/0030110 A1 | 2/2006 | Kumura et al. | |
| 2006/0118841 A1 | 6/2006 | Eliason et al. | |
| 2006/0124987 A1 | 6/2006 | Won et al. | |
| 2006/0151771 A1 | 7/2006 | Asano et al. | |
| 2006/0181918 A1 | 8/2006 | Shin et al. | |
| 2006/0284228 A1 | 12/2006 | Lee et al. | |
| 2007/0035984 A1 | 2/2007 | Arai | |
| 2007/0108524 A1 | 5/2007 | Ito et al. | |
| 2007/0236979 A1 | 10/2007 | Takashima | |
| 2007/0272960 A1 | 11/2007 | Hsu et al. | |
| 2007/0285970 A1 | 12/2007 | Toda et al. | |
| 2008/0182358 A1 | 7/2008 | Cowdery-Corvan et al. | |
| 2008/0191267 A1 | 8/2008 | Shin | |
| 2008/0217600 A1 | 9/2008 | Gidon | |
| 2008/0225569 A1 | 9/2008 | Nawano | |
| 2008/0265235 A1 | 10/2008 | Kamigaichi et al. | |
| 2008/0266949 A1 | 10/2008 | He et al. | |
| 2008/0273363 A1 | 11/2008 | Mouli | |
| 2009/0016094 A1 | 1/2009 | Rinerson et al. | |
| 2009/0026434 A1 | 1/2009 | Malhotra et al. | |
| 2009/0029513 A1 | 1/2009 | Blanchard | |
| 2009/0045390 A1 | 2/2009 | Rinerson et al. | |
| 2009/0078979 A1 | 3/2009 | Kumura et al. | |
| 2009/0095950 A1 | 4/2009 | Lieber et al. | |
| 2009/0141547 A1 | 6/2009 | Jin | |
| 2009/0153056 A1 | 6/2009 | Chen et al. | |
| 2009/0184393 A1 * | 7/2009 | Chen | H01L 28/91 257/532 |
| 2009/0209051 A1 | 8/2009 | Kang | |
| 2009/0250681 A1 | 10/2009 | Smythe et al. | |
| 2010/0039850 A1 | 2/2010 | Kitazaki | |
| 2010/0110753 A1 | 5/2010 | Slesazeck | |
| 2010/0110758 A1 | 5/2010 | Li | |
| 2010/0129938 A1 | 5/2010 | Kumura et al. | |
| 2010/0140589 A1 | 6/2010 | Ionescu | |
| 2010/0159641 A1 | 6/2010 | Rinerson et al. | |
| 2010/0195393 A1 | 8/2010 | Eggleston | |
| 2010/0207168 A1 | 8/2010 | Sills et al. | |
| 2010/0232200 A1 | 9/2010 | Shepard | |
| 2010/0270529 A1 | 10/2010 | Lung | |
| 2010/0271885 A1 | 10/2010 | Scheuerlein et al. | |
| 2010/0290294 A1 | 11/2010 | Siau | |
| 2010/0321975 A1 | 12/2010 | Kimura et al. | |
| 2011/0012085 A1 | 1/2011 | Deligianni et al. | |
| 2011/0033955 A1 | 2/2011 | Kang | |
| 2011/0037046 A1 | 2/2011 | Sato et al. | |
| 2011/0080767 A1 | 4/2011 | Rinerson et al. | |
| 2011/0147888 A1 | 6/2011 | Steigerwald et al. | |
| 2011/0188281 A1 | 8/2011 | Siau et al. | |
| 2011/0188284 A1 | 8/2011 | Chevallier et al. | |
| 2011/0210326 A1 | 9/2011 | Suzawa et al. | |
| 2011/0248324 A1 | 10/2011 | Kang | |
| 2011/0261607 A1 | 10/2011 | Tang | |
| 2011/0292713 A1 | 12/2011 | Perner | |
| 2012/0001144 A1 | 1/2012 | Greeley et al. | |
| 2012/0007167 A1 | 1/2012 | Hung et al. | |
| 2012/0012897 A1 | 1/2012 | Besser et al. | |
| 2012/0051137 A1 | 3/2012 | Hung et al. | |
| 2012/0052640 A1 | 3/2012 | Fischer et al. | |
| 2012/0140542 A1 | 6/2012 | Liu | |
| 2012/0164798 A1 | 6/2012 | Sills et al. | |
| 2012/0187363 A1 | 7/2012 | Liu | |
| 2012/0211722 A1 | 8/2012 | Kellam et al. | |
| 2012/0243306 A1 | 9/2012 | Karpov et al. | |
| 2012/0248398 A1 | 10/2012 | Liu | |
| 2012/0256246 A1 | 10/2012 | Izumi | |
| 2012/0280291 A1 | 11/2012 | Lee et al. | |
| 2012/0292584 A1 | 11/2012 | Rocklein et al. | |
| 2012/0292686 A1 | 11/2012 | Son et al. | |
| 2012/0319185 A1 | 12/2012 | Liang et al. | |
| 2012/0327714 A1 | 12/2012 | Lue | |
| 2013/0009125 A1 | 1/2013 | Park et al. | |
| 2013/0020575 A1 | 1/2013 | Ishizuka et al. | |

(56) References Cited

U.S. PATENT DOCUMENTS

| | | |
|---|---|---|
| 2013/0043455 A1 | 2/2013 | Bateman |
| 2013/0056698 A1 | 3/2013 | Satoh et al. |
| 2013/0056699 A1 | 3/2013 | Lung |
| 2013/0092894 A1 | 4/2013 | Sills et al. |
| 2013/0099303 A1 | 4/2013 | Huang et al. |
| 2013/0126816 A1 | 5/2013 | Tang et al. |
| 2013/0153984 A1 | 6/2013 | Ramaswamy |
| 2013/0193400 A1 | 8/2013 | Sandhu et al. |
| 2013/0214242 A1 | 8/2013 | Sandhu |
| 2014/0034896 A1 | 2/2014 | Ramaswamy et al. |
| 2014/0077150 A1 | 3/2014 | Ho et al. |
| 2014/0095853 A1 | 4/2014 | Sarangshar |
| 2014/0097484 A1 | 4/2014 | Seol et al. |
| 2014/0106523 A1 | 4/2014 | Koldiaev |
| 2014/0138753 A1 | 5/2014 | Ramaswamy et al. |
| 2014/0153312 A1 | 6/2014 | Sandhu et al. |
| 2014/0252298 A1 | 9/2014 | Li et al. |
| 2014/0254276 A1 | 9/2014 | Tokuhira et al. |
| 2014/0269002 A1 | 9/2014 | Jo |
| 2014/0269046 A1 | 9/2014 | Laurin et al. |
| 2014/0332750 A1 | 11/2014 | Ramaswamy et al. |
| 2014/0346428 A1 | 11/2014 | Sills et al. |
| 2014/0353568 A1 | 12/2014 | Boniardi et al. |
| 2015/0028280 A1 | 1/2015 | Sciarrillo et al. |
| 2015/0029775 A1 | 1/2015 | Ravasio et al. |
| 2015/0041873 A1 | 2/2015 | Karda et al. |
| 2015/0054063 A1 | 2/2015 | Karda et al. |
| 2015/0097154 A1 | 4/2015 | Kim et al. |
| 2015/0102280 A1 | 4/2015 | Lee |
| 2015/0123066 A1 | 5/2015 | Gealy et al. |
| 2015/0129824 A1 | 5/2015 | Lee et al. |
| 2015/0200202 A1 | 7/2015 | Karda et al. |
| 2015/0243708 A1 | 8/2015 | Ravasio et al. |
| 2015/0248931 A1 | 9/2015 | Nazarian |
| 2015/0249113 A1 | 9/2015 | Takagi et al. |
| 2015/0311349 A1 | 10/2015 | Ramaswamy |
| 2015/0340610 A1 | 11/2015 | Jung et al. |
| 2015/0349255 A1 | 12/2015 | Pellizzer et al. |
| 2015/0357380 A1 | 12/2015 | Pellizzer |
| 2015/0364565 A1 | 12/2015 | Ramaswamy et al. |
| 2015/0380641 A1 | 12/2015 | Ino et al. |
| 2016/0005961 A1 | 1/2016 | Ino |
| 2016/0020389 A1 | 1/2016 | Ratnam et al. |
| 2016/0043143 A1 | 2/2016 | Sakotsubo |
| 2016/0104748 A1 | 4/2016 | Ravasio et al. |
| 2016/0240545 A1 | 8/2016 | Karda et al. |
| 2017/0025604 A1 | 1/2017 | Sills et al. |
| 2017/0069726 A1 | 3/2017 | Kye et al. |
| 2017/0186812 A1 | 6/2017 | Lee et al. |
| 2017/0243918 A1 | 8/2017 | Terai et al. |
| 2018/0059958 A1 | 3/2018 | Ryan et al. |
| 2018/0197870 A1 | 6/2018 | Balakrishnan et al. |
| 2018/0269216 A1 | 9/2018 | Lee |
| 2018/0286875 A1 | 10/2018 | Okada et al. |
| 2019/0130956 A1 | 5/2019 | Muller et al. |
| 2019/0189357 A1 | 6/2019 | Chavan et al. |
| 2020/0090769 A1 | 3/2020 | Maeda |
| 2020/0411528 A1* | 12/2020 | Sung .................. H01L 27/1082 |

FOREIGN PATENT DOCUMENTS

| | | |
|---|---|---|
| CN | 100483542 | 4/2009 |
| CN | 102263122 | 11/2011 |
| CN | 103746073 | 4/2014 |
| CN | 104051231 | 9/2014 |
| EP | 1624479 | 2/2006 |
| JP | H09-232447 | 9/1997 |
| JP | H10-93083 | 10/1998 |
| JP | H10-284006 | 10/1998 |
| JP | H11-274429 | 10/1999 |
| KR | 10-0799129 | 1/2008 |
| KR | 10-2008-0092812 | 10/2008 |
| KR | 10-2017-0028666 | 3/2017 |
| TW | 201729354 | 8/2017 |
| TW | 201842651 | 12/2018 |
| TW | 201907545 | 2/2019 |
| TW | 201917870 | 5/2019 |
| WO | WO 1999/014761 | 3/1999 |
| WO | WO 2008/073529 | 6/2008 |
| WO | WO 2008/126961 | 10/2008 |

OTHER PUBLICATIONS

WO PCT/US2020/037261 Search Rept., dated Sep. 23, 2020, Micron Technology, Inc.

WO PCT/US2020/037261 Written Opin, dated Sep. 23, 2020, Micron Technology, Inc.

Arimoto et al., "Current Status of Ferroelectric Random-Acess Memory", MRS Bulletin, Nov. 2004, United Kingdom, pp. 823-828.

Das et al., "High Performance Multliayer MoS2 Transistors with Scandium Contacts", NANO Letters, ACS Publications, Dec. 14, 2012, United States, pp. 100-105.

Kim et al., "A Functional Hybrid Memristor Crossbar-Array/CMOS System for Data Storage and Neuromorphic Applications", Nano Letters, Dec. 5, 2011, United States, pp. 389-395.

Lee et al., "Ferroelectric Nonvolatile Nanowire Memory Circuit Using a Single ZnO Nanowire and Copolymer Top Layer", Advanced Materials vol. 24, 2012, United States, pp. 3020-3025.

Lee et al., "Internal Resistor of Multi-Functional Tunnel Barrier for Selectivity and Switching Uniformity in Resistive Random Access Memory", Nanoscale Research Letters, 2014, Germany, 7 pages.

Lee et al., "MoS2 Nanosheets for Top-Gate Nonvolatile Memory Transistor Channel", Small vol. 8, No. 20, 2012, Germany, pp. 3111-3115.

Lembke et al., "Breakdown of High-Performance Monolayer MoS2 Transistors", ACS Nano (www.acsnano.org), Oct. 2, 2012, United States, pp. A-F.

Liu et al., "Growth of Large-Area and Highly Crystailine MoS2 Thin Layers on Insulating Substrates", NANO Letters, ACS Publications, Feb. 27, 2012, United States, pp. 1538-1544.

Liu et al., "Role of Metal Contacts in Designing High-Performance Monolayer n-Type WSe2 Field Effect Transistors", NANO Letters, ACS Publications, Mar. 25, 2013, United States, pp. 1983-1990.

Lous, "Ferroelectric Memory Devices: How to Store the Information of the Future?", Top Master Programme in Nanoscience, Jul. 2011, Netherlands, 23 pages.

Min et al., "Nanosheet Thickness-Modulated MoS2 Dielectric Property Evidenced by Field-Effect Transistor Performance", Nanoscale, The Royal Society of Chemistry, Dec. 3, 2012, United Kingdom, 2 pages.

Pandey et al., "Structural, Ferroelectric and Optical Properties of PZT Thin Films", Physica B: Condensed Matter vol. 369, Aug. 2005, Netherlands, pp. 135-142.

Radisavljevic et al., "Single-Layer MoS2 Transistors", Nature Nanotechnology vol. 6, Mar. 2011, United Kingdom, pp. 147-150.

Robertson, "Band Offsets of Wide-Band-Gap Oxides and Implications for Future Electronic Devices", Journal of Vacuum Science & Technology B vol. 18, No. 3, Feb. 2000, United States, pp. 1785-1791.

Sakai et al., "Recent Progress of Ferroelectric-Gate Field-Effect Transistors and Applications to Nonvolatile Logic and FeNAND Flash Memory", Materials vol. 3, Nov. 2010, Switzerland, pp. 4950-4964.

Tokumitsu et al., "Nonvolatile Ferroelectric-gate Field-Effect Transistors using SrBi2Ta2O9/Pt/SrTa2O6/SiON/Si Structures", Applied Physics Letters vol. 75, No. 4, Jul. 26, 1999, United States, pp. 575-577.

Wikipedia, "Ferroelectric RAM", available online at http://en.wikipedia.org/wiki/Ferroelectric_RAM, Feb. 25, 2013, 6 pages.

Zhan et al., "Large Area Vapor Phase Growth and Characterization of MoS2 Atomic Layers on SiO2 Substrate", Department of Mechanical Engineering & Materials Science, Rice University, Feb. 15, 2012, United States, 24 pages.

Zhang et al., "Ambipolar MoS2 Thin Flake Transistors", NANO Letters, ACS Publications, Jan. 25, 2012, United States, pp. 1136-1140.

(56) References Cited

OTHER PUBLICATIONS

Junlabhut et al., "Optical Absorptivity Enhancement of SiO2 Thin Film by Ti and Ag Additive", Energy Procedia vol. 34, Dec. 2013, United Kingdom, pp. 734-739.
Katiyar et al., "Electrical Properties of Amorphous Aluminum Oxide Thin Films", Acta Materialia vol. 55, Dec. 2005, Netherlands, pp. 2617-1622.
Li et al., "Low-Temperature Magnetron Sputter-Deposition, Hardness, and Electrical Resistivity of Amorphous and Crystalline Alumina Thin Films", Journal of Vacuum Science & Technology A vol. 18, No. 5, Sep.-Oct. 2000, United States, pp. 2333-2338.
Lv et al., "Transition Metal Dichalcogenides and Beyond: Synthesis, Properties, and Applications of Single- and Few-layer Nanosheets", American Chemical Society Accounts of Chemical Research vol. 48, Dec. 9, 2014, United States, pp. 56-64.
Podgornyi et al., "Leakage Currents in Thin Ferroelectric Films", Physics of the Solid State vol. 54, No. 5, Dec. 2012, Germany, pp. 911-914.
Pontes et al., "Synthesis, Optical and Ferroelectric Properties of PZT Thin Films: Experimental and Theoretical Investigation", Journal of Materials Chemistry vol. 22, Dec. 2012, United Kingdom, pp. 6587-6596.
Rotaru et al., "Amorphous Phase Influence on the Optical Bandgap of Polysilicon", Physica Status Solidi (A) vol. 171, 1999, Germany, pp. 365-370.
Schroeder et al., "Hafnium Oxide Based CMOS Compatible Ferroelectric Materials", ECS Journal of Solid State Science and Technology vol. 2(4), Jan. 28, 2013, United States, pp. N69-N72.
U.S. Appl. No. 16/255,569, filed Jan. 23, 2019, by Calderoni et al.
TW 109122023 Search Rep., dated Apr. 9, 2021, Micron Technology, Inc.

* cited by examiner

US 11,170,834 B2

MEMORY CELLS AND METHODS OF FORMING A CAPACITOR INCLUDING CURRENT LEAKAGE PATHS HAVING DIFFERENT TOTAL RESISTANCES

TECHNICAL FIELD

Embodiments disclosed herein pertain to memory cells and to methods of forming a capacitor including current leakage paths having different total resistances.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the wordlines may conductively interconnect memory cells along rows of the array. Each memory cell may be uniquely addressed through the combination of a digitline and a wordline.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

One type of memory cell has a select device electrically coupled in series with a ferroelectric capacitor. Current typically leaks through the select device to adjacent substrate material even when the select device is idle (i.e., when inactive or "off"). This leads to voltage drop at the adjacent electrode of the ferroelectric capacitor, thus creating a voltage differential between the two capacitor electrodes. This results in an electric field being applied across the ferroelectric material when the memory cell is idle. Even if small, such an electric field may start to flip individual dipoles in the ferroelectric material and continue until all are flipped, thus erasing a programmed state of the memory cell. This can occur over a small amount of time, thereby destroying or preventing non-volatility in the memory cell.

DETAILED DESCRIPTION OF EXAMPLE EMBODIMENTS

Figure 1:
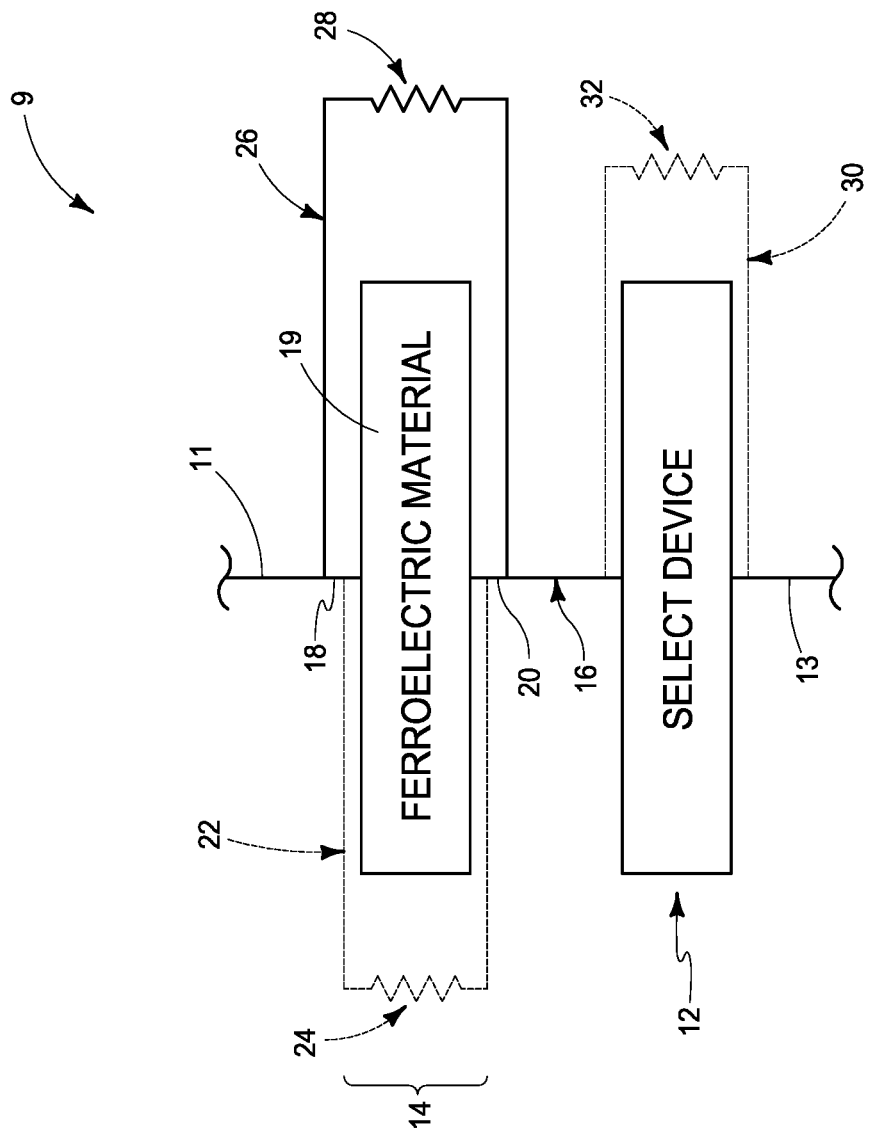
FIG. 1 is a schematic-like diagrammatic view of a memory cell in accordance with an embodiment of the invention.

A memory cell 9 in accordance with an embodiment of the invention is shown and initially described with reference to a schematic-like FIG. 1. Integrated circuitry (not shown) having memory cell 9 would likely have thousands or millions of such memory cells fabricated relative to a memory array or sub-array. Such arrays or sub-arrays would likely have a plurality of wordlines and digitlines having individual memory cells 9 there-between where such cross. Individual memory cells may be considered as comprising the portions of an individual wordline and a crossing individual digitline.

Memory cell 9, in one embodiment, comprises a select device 12 and a capacitor 14 electrically coupled in series (i.e., circuit) with select device 12, for example by a conductive (i.e., electrically) path 16 as shown. Capacitor 14 in the depicted diagram may be considered as comprising two conductive capacitor electrodes 18 and 20 having capacitor insulator material 19 there-between. In one embodiment, capacitor insulator material 19 is ferroelectric. Physically, path 16 may simply be a single electrode shared by capacitor 14 and select device 12. Capacitor 14 comprises an intrinsic current (i.e., electrical) leakage path from one of capacitor electrodes 18 or 20 to the other through capacitor insulator material 19. Such intrinsic path is diagrammatically shown as a dashed line in a path 22 going around capacitor insulator material 19 for clarity in FIG. 1. However, in reality, path 22 would intrinsically/inherently be through capacitor insulator material 19 to and between each of capacitor electrodes 18 and 20. Intrinsic current leakage path 22 will have some comparatively rather high overall/total resistance (i.e., electrical) which is diagrammatically indicated as a resistor 24 as device 14 in operation functions as a capacitor. Total resistance of resistor 24 will depend upon composition of capacitor insulator material 19, thickness of capacitor insulator material 19, and dipole orientation within material 19 if ferroelectric. Resistor 24 may inherently be a non-linear/variable resistor whereby its resistance is voltage dependent.

Memory cell 9 comprises a parallel (i.e., circuit-parallel) current leakage path 26 from one capacitor electrode 18 or 20 to the other. In one embodiment, parallel path 26 has a dominant band gap of 0.4 eV to 5.0 eV, and in one embodiment that is less than that of capacitor insulator material 19. Such may be greater than dominant band gap of capacitor insulator material 19 if parallel path 26 is sufficiently shorter in length than path 22. Regardless, in one embodiment parallel path 26 has some total resistance (e.g., shown as a resistor 28) that is lower than the total resistance of intrinsic current leakage path 22. By way of examples only, total resistance through intrinsic current leakage path 22 may be $1 \times 10^{11}$-$1 \times 10^{18}$ ohms and total resistance through parallel path 26 may be $1 \times 10^{7}$-$1 \times 10^{17}$ ohms. In one embodiment, the parallel current leakage path is configured so that current there-through when the memory cell is idle is no more than one nanoampere.

Select device 12 when present may be any existing or yet-to-be-developed select device, including multiple devices. Examples include diodes, field effect transistors, and bipolar transistors. In operation, select device 12 may exhibit current leakage when the memory cell is idle (i.e., when the integrated circuitry associated with memory cell 9 is operationally "on", but no "read" or "write" operation of memory cell 9 is occurring). A select device current leakage path 30 may exist, and is diagrammatically shown as a dashed line around select device 12, although such may be intrinsically/inherently through select device 12 or to underlying substrate (e.g., held at ground or other potential). Leakage path 30 is shown as having some total resistance 32. In one embodiment, parallel path 26 is configured so that current there-through when memory cell 9 is idle is greater than or equal to current leakage through path 30 when memory cell 9 is idle. Such will be dependent upon the construction and materials of select device 12, capacitor 14, parallel path 26, and upon voltages at various points within memory cell 9 in normal operation. Ideally and regardless, such enables voltage at electrodes 18 and 20 to be equal or at least very close to one another (e.g., within 50 millivolts) when idle whereby no or negligible electric field is created within capacitor insulator material 19 when memory cell 9 is idle. For example, and further, any voltage differential across the capacitor when idle ideally is such that any electric field in capacitor insulator material 19 is at least 20 times lower than the intrinsic coercive field of capacitor insulator material 19. Such may preclude unintended dipole direction change within a ferroelectric material 19. Alternately as examples, such may at least reduce risk of or increase time until unintended dipole direction change within a ferroelectric material 19.

In one embodiment, resistor 28 in parallel path 26 is a non-linear resistor between capacitor electrodes 18 and 20 exhibiting overall higher resistance at higher voltages (e.g., between 1 to 5 Volts) than at lower voltages (e.g., less than 250 millivolts). Ideally, such a non-linear resistor is formed towards providing a greater magnitude of reduction of current leakage in parallel path 26 during higher voltage "read" and "write" operations as compared to when idle at lower voltage.

A wordline and a digitline (neither being shown in FIG. 1) may be associated with memory cell 9. For example, select device 12 when present may be a simple two terminal diode or other two terminal device. A cross point-like array construction may then be used whereby a conductive path 11 as part of first capacitor electrode 18 connects with or is part of a wordline or digitline (not shown in FIG. 1) and a conductive path 13 as part of select device 12 connects with or is part of the other of a wordline or digitline (not shown in FIG. 1). As an alternate example, select device 12 may be a field effect transistor. Then, as an example, conductive path 11 may be part of a capacitor electrode 18 that is common to multiple capacitors 14 (not shown in FIG. 1) within a memory array or sub-array, component 16 may be one source/drain region of the transistor, and component/conductive path 13 may be the other. The gate (not shown in FIG. 1) of the transistor may be a portion of a wordline (not shown in FIG. 1), and source/drain component 13 may connect with or be part of a digitline (not shown in FIG. 1). Other architectures and constructions could alternately of course be used.

FIGS. 2-5 diagrammatically show an example physical construction of a portion of a memory cell 9 comprising capacitor 14 and parallel current leakage path 26 in accordance with an example embodiment of the invention. Like numerals from the above-described embodiments have been used where appropriate, with some differences or additions being indicated with different numerals. FIGS. 2-5 depict a portion of a fragment or construction 10 comprising a base substrate 50 (FIG. 2) that may include any one or more of conductive/conductor/conducting, semiconductive/semiconductor/semiconducting, or insulative/insulator/insulating (i.e., electrically herein) materials. Various materials have been formed elevationally over base substrate 50. Materials may be aside, elevationally inward, or elevationally outward of the FIGS. 2-5-depicted materials. For example, other partially or wholly fabricated components of integrated circuitry may be provided somewhere above, about, or within base substrate 50. Control and/or other peripheral circuitry for operating components within an array (e.g., a memory array) may also be fabricated and may or may not be wholly or partially within an array or sub-array. Further, multiple sub-arrays may also be fabricated and operated independently, in tandem, or otherwise relative one another. In this document, a "sub-array" may also be considered as an array. Select device 12 may be electrically coupled to either one of capacitor electrodes 18 or 20, with such shown being schematically connected to electrode 18 through a conductor 56.

An insulative-comprising material 52 is shown as being above base substrate 50 and has a capacitor opening 15 therein. By way of example only, such is shown as comprising material 53 above base substrate 50, material 54 above material 53, and material 55 above material 54. An example material 53 is silicon nitride above silicon dioxide. An example material 54 is doped silicon dioxide, and an example material 55 is silicon nitride. Example construction 10 comprises lower conductor 56 which, for example, may be a conductive line running into and out of the plane of the page upon which FIG. 2 lies, for example a wordline or a digitline, or be electrically coupled (in one embodiment, directly electrically coupled) to or part of a select device 12. An example conductive material for conductor 56 is TiN.

Capacitor 14 comprises a first conductive capacitor electrode 18 that in one embodiment has laterally-spaced walls 58, 59 that individually have a topmost surface 60, laterally-innermost surfaces 31, and laterally-outermost surfaces 33. In one embodiment, first capacitor electrode 18 has a bottom 62 extending laterally to and between laterally-spaced walls 58, 59. Alternately and by way of example only, first capacitor electrode 18 may comprise an upwardly and downwardly-open (not shown) conductive material cylinder (e.g., little or no bottom 62 extending between walls 58, 59). Capacitor 14 includes a second conductive capacitor electrode 20 having example lateral sidewall surfaces 29. Second capacitor electrode 20 is shown as comprising a conductive material 64 (e.g., W) and a conductive material 66 (e.g., TiN). Second capacitor electrode 20 may be considered as comprising a portion 70 that is above first capacitor electrode 18.

Capacitor insulator material 19 is laterally-between second capacitor electrode 20 and first capacitor electrode 18, including laterally between walls 58, 59 of first capacitor electrode 18. Example materials include silicon dioxide, silicon nitride, high-k dielectrics, and/or ferroelectric material. Example ferroelectric materials include ferroelectrics that have one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element. As asserted above with respect to FIG. 1, capacitor 14 in FIGS. 2-5 comprises an intrinsic current leakage path 22 from one of the first and second capacitor electrodes to the other through the capacitor insulator material. Example capacitor insulator material 19 comprises a topmost surface 25 and laterally-spaced walls 23, 27.

Parallel current leakage path 26 is shown as being encompassed by or within a leaker material 34 that in one embodiment comprises laterally-spaced walls 37, 39. Example path 26 is shown as extending between a) an elevationally inner surface 71 of portion 70 of second capacitor electrode 20 that is above first capacitor electrode 18, and b) at least one of individual topmost surfaces 60 (in one embodiment and as shown both topmost surfaces 60) of laterally-spaced walls 58, 59 of first capacitor electrode 18. As shown, parallel current leakage path 26 is circuit-parallel intrinsic current leakage path 22, and is also of lower total resistance than the intrinsic current leakage path. Example leaker materials 34 include one or more of amorphous silicon, polycrystalline silicon, germanium, chalcogenide (e.g., metal dichalcogenides), silicon-rich silicon nitride, silicon-rich silicon oxide, and intrinsically dielectric material suitably doped with conductivity increasing dopants (e.g., $SiO_2$ and/or and $Si_3N_4$ doped with one or more of Ti, Ta, Nb, Mo, Sr, Y, Cr, Hf, Zr, W, and lanthanide series ions). Leaker material 34, and thereby parallel path 26, may predominantly (i.e., more than 50 atomic %) comprise such material(s). Any of these materials may be doped or undoped to provide desired total resistance for current leakage flow there-through, for example when memory cell 9 is idle.

In one embodiment, leaker material 34 is everywhere laterally-outward of laterally-innermost surfaces 31 of laterally-spaced walls 58, 59 of first capacitor electrode 18. In one embodiment, at least some of leaker material 34 (in one such embodiment only some) is laterally-outward of laterally-outermost surfaces 33 of laterally-spaced walls 58, 59 of first capacitor electrode 18. In one embodiment, leaker material 34 has maximum lateral thickness T1 above individual of laterally-spaced walls 58, 59 that is greater than maximum lateral thickness T2 of capacitor insulator material 19 below topmost surfaces 60 of individual laterally-spaced walls 58, 59. In one embodiment, leaker material 34 is directly above less than all of topmost surfaces 60 of laterally-spaced walls 58, 59. In one embodiment, leaker material 34 is not directly above topmost surface 25 of capacitor insulator material 19. In one embodiment, leaker material 34 is not directly against any lateral sidewall surface 29 of second capacitor electrode 20. In one embodiment, leaker material 34 comprises an annulus 90. In one embodiment, capacitor insulator material 19 comprises laterally-spaced walls 23, 27 in capacitor opening 15 that are laterally thicker in capacitor opening 15 above laterally-spaced walls 58, 59 than laterally-aside laterally-spaced walls 58, 59 in capacitor opening 15. In one embodiment, leaker material 34 comprises laterally-spaced walls 37, 39 in capacitor opening 15 that are laterally thinner in capacitor opening 15 than individual of laterally-spaced walls 58, 59 of first capacitor electrode 18 in capacitor opening 15.

In one embodiment, leaker material 34 is homogenous whereby parallel path 26 between capacitor electrodes 18 and 20 is homogenous. In one embodiment, leaker material 34 is non-homogenous whereby parallel path 26 between capacitor electrodes 18 and 20 is non-homogenous. In an embodiment where material 34 and thereby parallel path 26 are non-homogenous, parallel path 26 may have multiple band gaps due to different composition materials therein having different band gaps. Yet, parallel path 26 may have a dominant (meaning controlling) band gap of 0.4 eV to 5.0 eV, in one embodiment, likely dependent on the respective volumes of the individual different materials within parallel path 26. Accordingly, and regardless, "dominant" is used and applies herein regardless of homogeneity of the particular path/material. In one embodiment, dominant band gap of capacitor insulator material 19 may be lower than that of parallel path 26. In one embodiment, minimum length of parallel path 26 is made longer than minimum thickness of capacitor insulator material 19. As one example, such a length relationship may be used when density of states in the parallel path is equal to or greater than that in the capacitor insulator material when dominant band gaps of the capacitor insulator material and parallel path are about the same. As another example, such a length relationship may be used when density of states in the parallel path is equal to or greater than that in the capacitor insulator material when dominant band gap of the capacitor insulator material is less than that of the parallel path.

Figure 2:
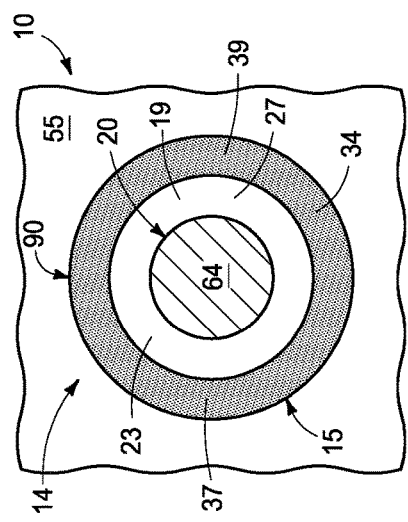
FIG. 2 is a diagrammatic cross-sectional view of a memory cell in accordance with an embodiment of the invention.
Figure 3:
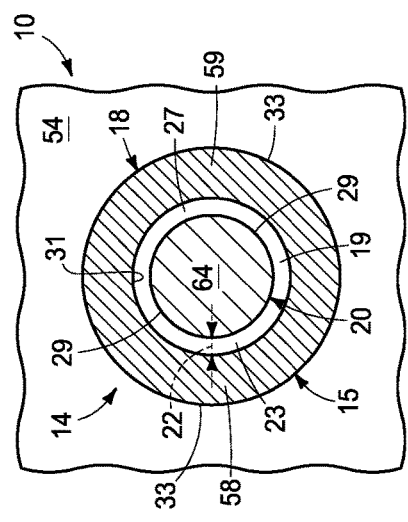
FIG. 3 is an enlarged cross-sectional view taken through line 3-3 in FIG. 2.
Figure 4:
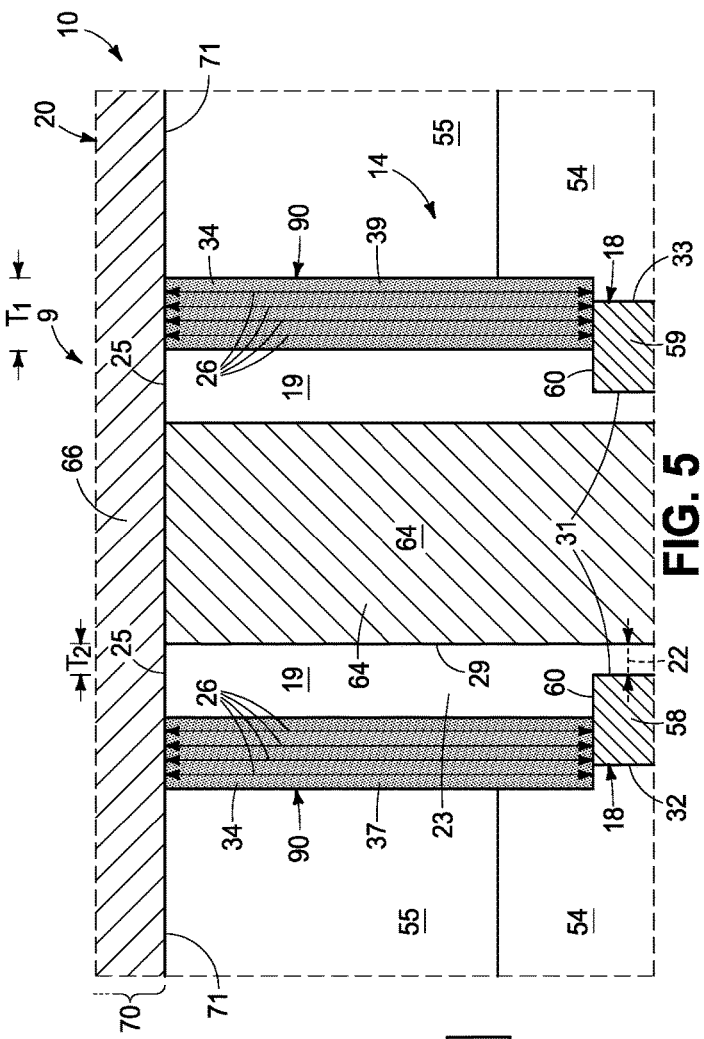
FIG. 4 is an enlarged cross-sectional view taken through line 4-4 in FIG. 2.
Figure 5:
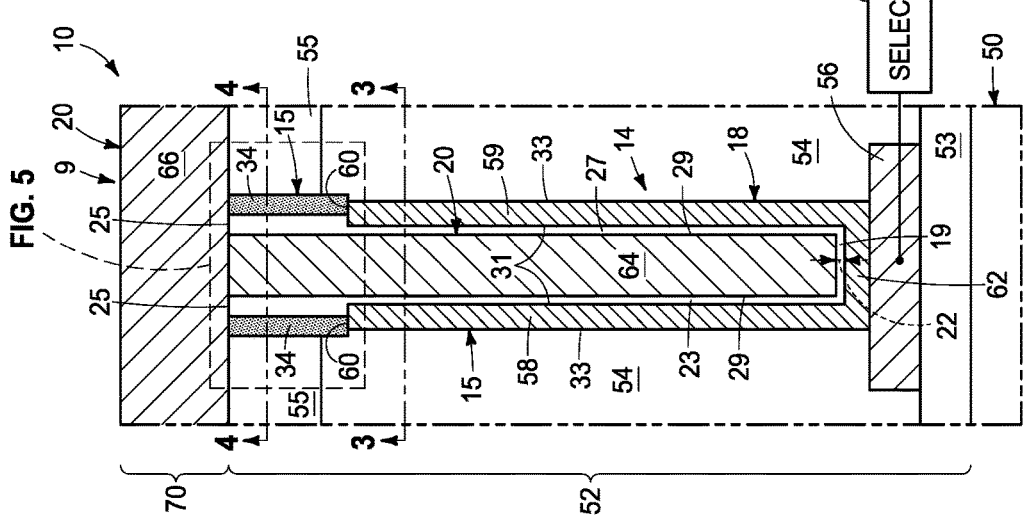
FIG. 5 is an enlarged cross-sectional view of a portion of FIG. 2.

In one embodiment, memory cell 9 comprises a select device, for example a select device 12 schematically shown as electrically coupling (in one embodiment directly electrically coupling) with first capacitor electrode 18 through conductor 56 in FIG. 2. In one such embodiment, in operation, the select device exhibits currents leakage when the memory cell is idle, with the parallel path being configured so that current there-through when the memory cell is idle is greater than or equal to said current leakage of the select device when the memory cell is idle.

Figure 6:
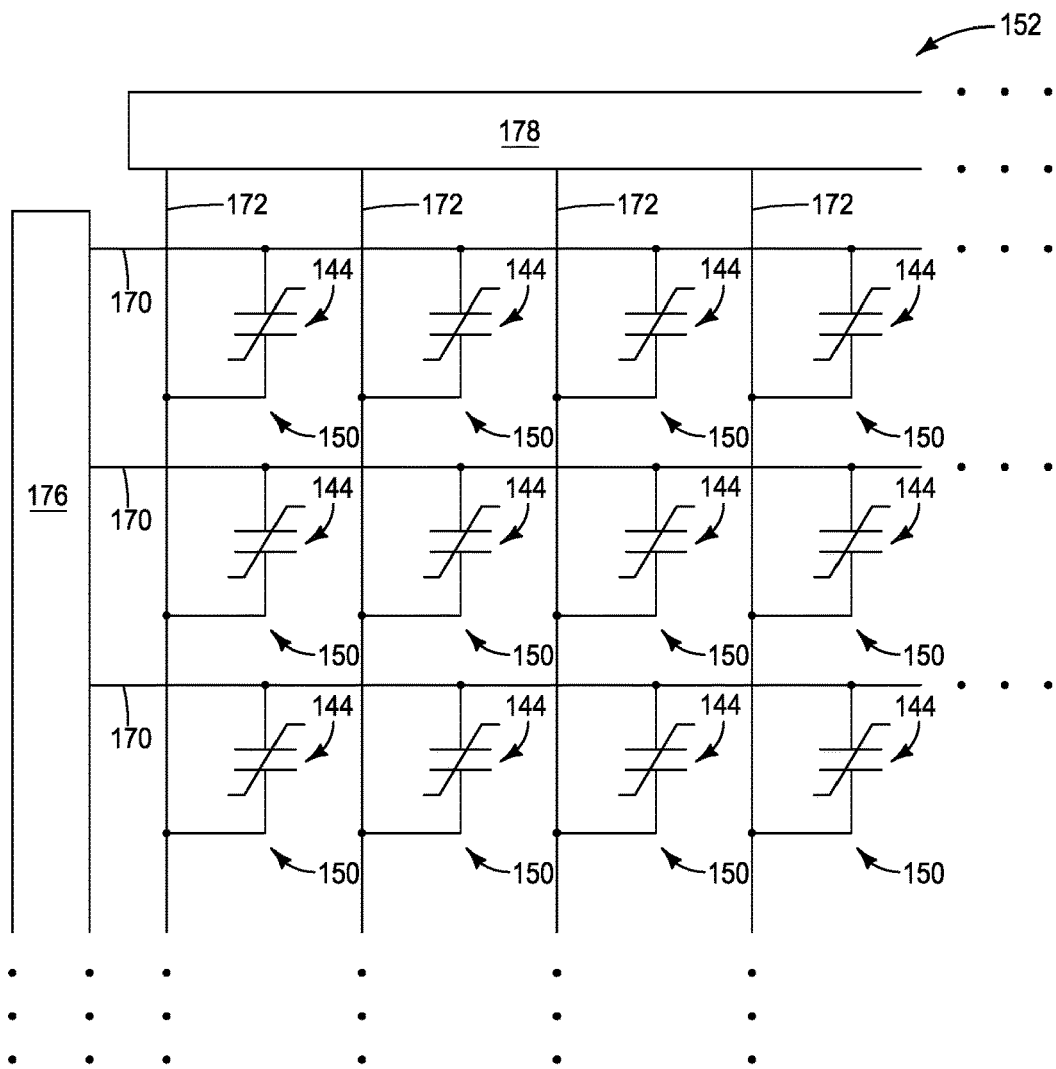
FIG. 6 is a schematic diagram of an example memory array comprising ferroelectric capacitors.

Memory arrays may incorporate capacitors as described above, which may be ferroelectric memory arrays, and may have any suitable configuration. An example ferroelectric memory array 152 is described with reference to FIG. 6.

Memory array 152 includes a plurality of ferroelectric capacitors 144, for example that may be of the configuration of capacitor 14 described above. Wordlines 170 extend along rows of memory array 152 and digitlines 172 extend along columns of memory array 152. Each of capacitors 144 is within a memory cell 150 which is uniquely addressed using a combination of a wordline and a digitline. Wordlines 170 extend to driver circuitry 176 and digitlines 172 extend to detecting circuitry 178. In some applications, memory array 152 may be configured as ferroelectric random-access memory (FeRAM).

Figure 7:
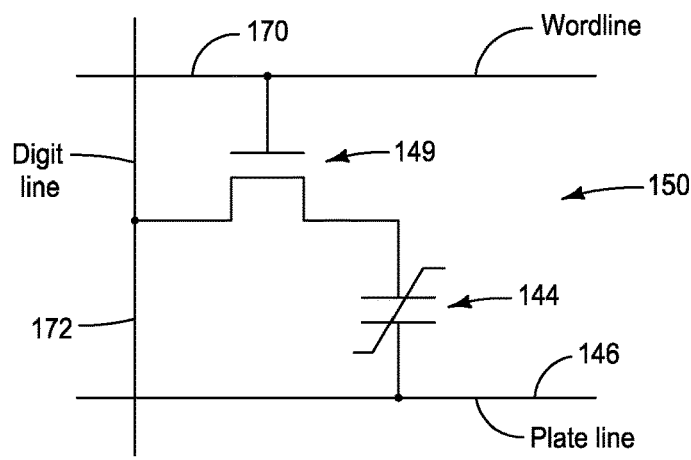
FIG. 7 is a schematic diagram of an example memory cell comprising a ferroelectric capacitor.

Memory cells 150 may include transistors 149 (e.g., select devices) in combination with ferroelectric capacitors 144. For instance, in some applications, each of memory cells 150 may include one of transistors 149 in combination with a ferroelectric capacitor 144 as shown in FIG. 7. Memory cell 150 is shown coupled with a wordline 170 and a digitline 172. Also, one of the electrodes of the capacitor 144 is shown coupled with a plate line comprising plate material 146 (e.g., a second capacitor electrode 20 as referred to in the above embodiments and that may be common to multiple capacitors in an array of the capacitors). The plate line may be used in combination with wordline 170 for controlling an operational state of one or more ferroelectric capacitors 144. Any other attribute(s) or aspect(s) as described herein and/or shown may be used.

Embodiments of the invention encompass methods of forming a capacitor and as well memory cells as identified above independent of method of manufacture. Nevertheless, such methods may have any of the attributes as described above in structure embodiments. Likewise, the above-described structure embodiments may incorporate and form any of the attributes described below with respect to method embodiments. Example method embodiments are described with reference to FIGS. 8-14. Like numerals from above-described embodiments have been used for predecessor materials/constructions that result in a finished construction as shown, for example, in FIGS. 2-5.

Figure 8:
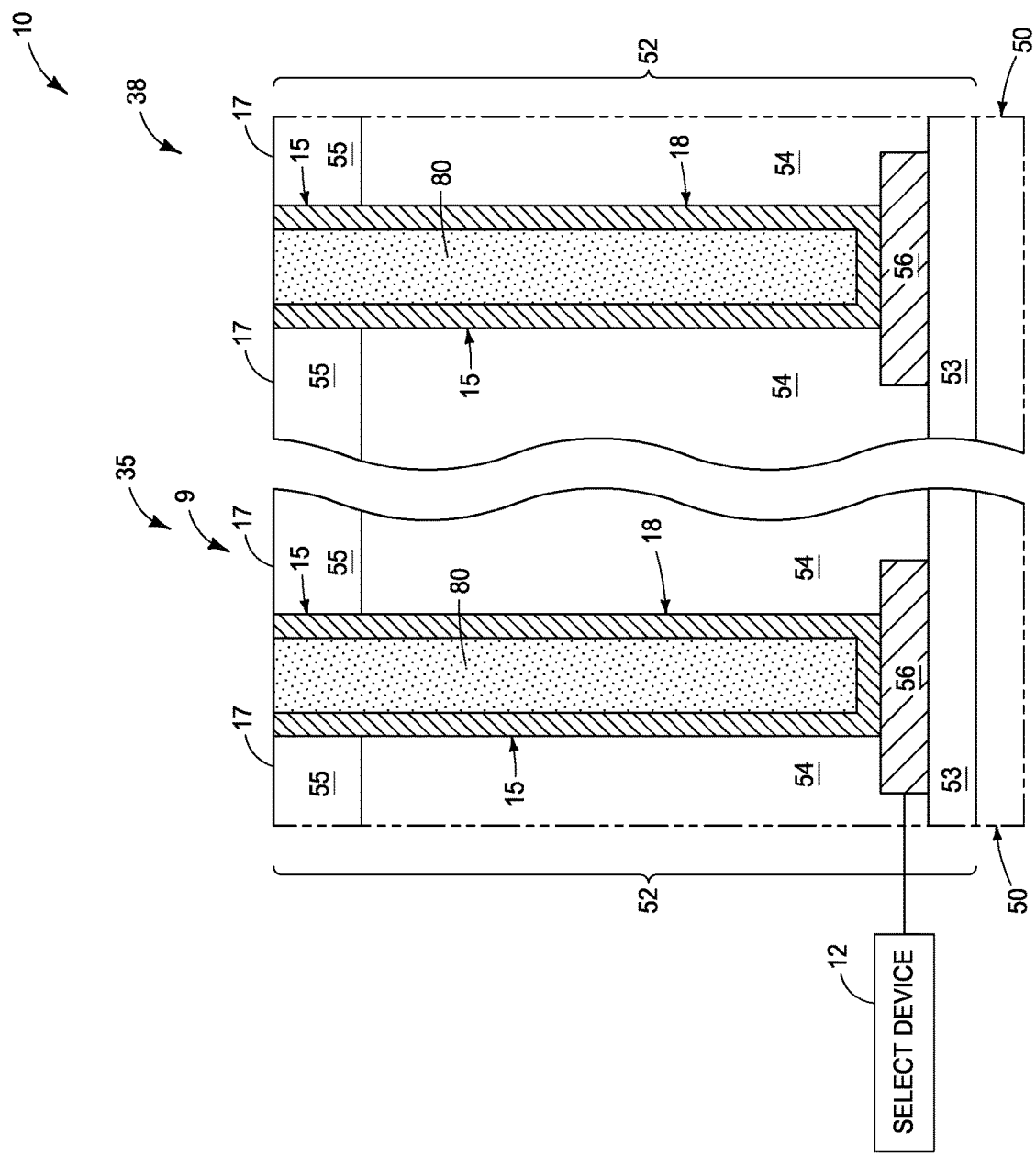
FIG. 8 is a diagrammatic cross-sectional view of a portion of a construction in process in accordance with some embodiments of the invention.

Referring to FIG. 8, a conductive lining 18 has been formed in individual capacitor openings 15 in insulative-comprising material 52 in a first area 35 and in a second area 38 of substrate construction 10. By way of example only, an example first area 35 may comprise an array of capacitors and/or memory cells and second area 38 may comprise peripheral circuitry area, for example comprising logic and/or control circuitry for writing to or reading from memory cells within first area 35. Second area 38 may also comprise an array of capacitors independent or part of logic, control, or other circuitry. An example technique for forming capacitor openings 15 includes photolithographic patterning and etch with or without pitch multiplication. Capacitor openings 15 may be of any one or more shapes in horizontal cross-section, for example circular, ellipsoidal, four-sided (e.g., square or rectangular), six-sided, a combination of straight and curved sides, etc. Capacitor openings 15 are shown as having straight vertical sidewalls, although such may be non-vertical and/or not straight. Likely several capacitor openings 15 would be formed in areas 35 and 38 for forming several capacitors simultaneously. Conductive linings 18 will ultimately comprise first capacitor electrodes of capacitors being formed in capacitor openings 15.

Sacrificial material 80 has been formed laterally-inward of conductive linings 18. Examples include spin-on-carbon, spin-on-dielectric, and photoresist. An example technique of forming the construction of FIG. 8 is to initially form capacitor openings 15 in insulative-comprising material 52. This may be followed by deposition of conductive linings 18 to be within capacitor openings 15 and atop respective top surfaces 17 of insulative-comprising material 52 immediately-laterally-adjacent capacitor openings 15. Sacrificial material 80 then may be deposited to overfill remaining volume of capacitor openings 15 and atop material of conductive lining 18 that is atop surfaces 17 of insulative-comprising material 52. Then, sacrificial material 80 and material of conductive lining 18 may be planarized/polished back at least to top surfaces 17 to form the construction as shown in FIG. 8.

Figure 9:
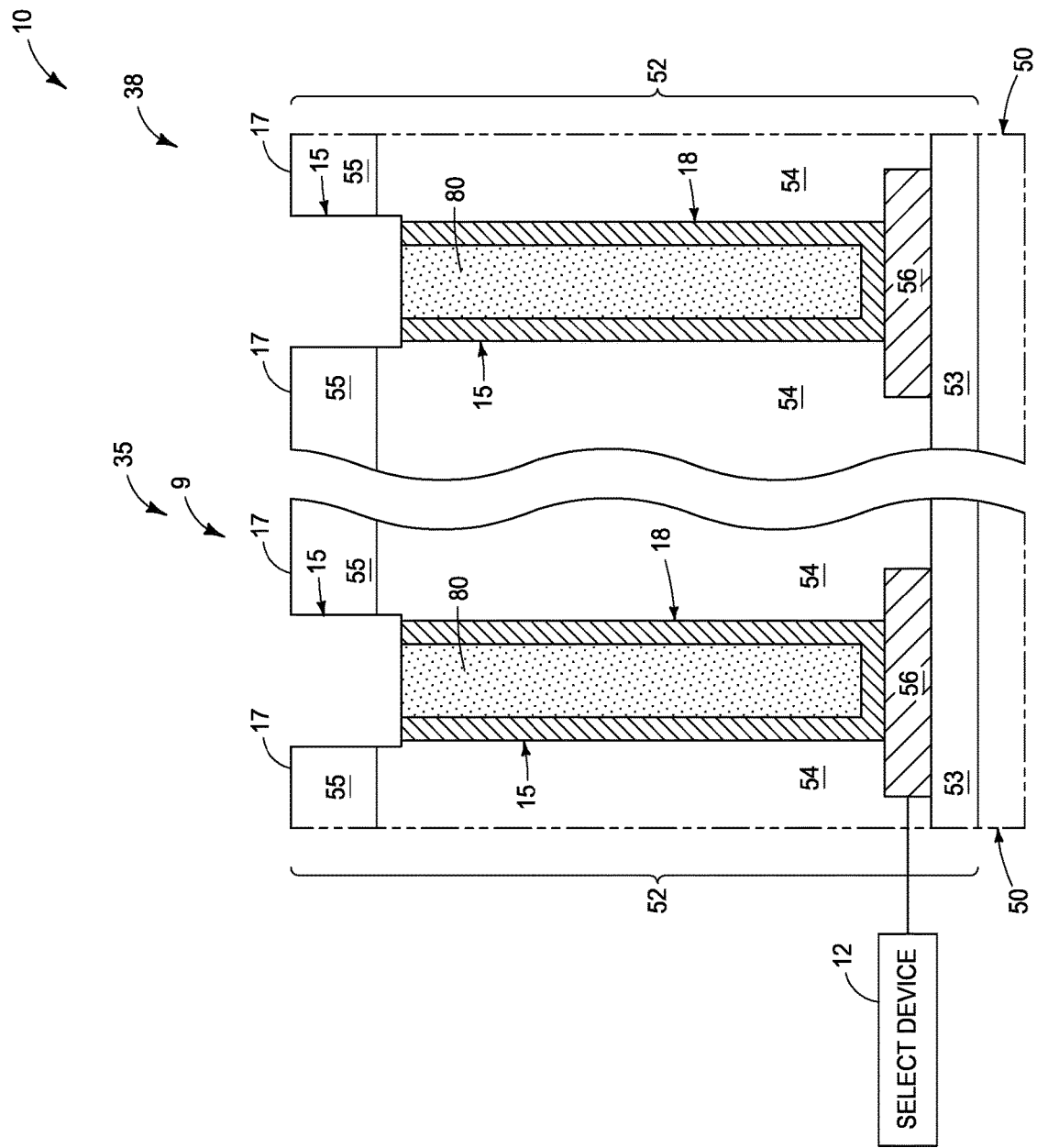
FIGS. 9-14 are diagrammatic sequential cross-sectional views of the construction of FIG. 8 in process in accordance with some embodiments of the invention.

Referring to FIG. 9, conductive linings 18 and sacrificial material 80 have been vertical recessed in capacitor openings 15 in first and second areas 35 and 38, respectively, relative to top surfaces 17 of insulative-comprising material 52 thus, for example, completing fabrication of example first capacitor electrodes 18. In one embodiment and as shown, such vertically recessing of conductive linings 18 and sacrificial material 80 in capacitor openings 15 widens capacitor openings 15 above conductive linings 18. In one embodiment, the vertically recessing of conductive linings 18 and sacrificial material 80 in capacitor openings 15 occurs at the same time. An example technique for doing so comprises chemical etching. For example where sacrificial material 80 comprises spin-on-carbon and conductive linings 18 comprise TiN, an example etching chemistry that will etch spin-on-carbon and TiN at substantially the same rate includes a combination of ammonia and hydrogen peroxide, and which also may slightly widen capacitor openings 15 in insulative-comprising material 52 when such comprises one or more of silicon dioxide and silicon nitride. In another embodiment, the vertically recessing of conductive linings 18 and sacrificial material 80 in capacitor openings 15 occurs at different time-spaced periods of time. Again, by way of example, such may be conducted using a chemistry that selectively etches one of materials of conductive lining 18 and sacrificial material 80 selectively relative to the other, followed by using another etching chemistry that will selectively etch the other relative to the one. Where such vertically recessing occurs at different time-space periods of time, either material of conductive lining 18 or sacrificial material 80 may be etched first selectively relative to the other.

Figure 10:
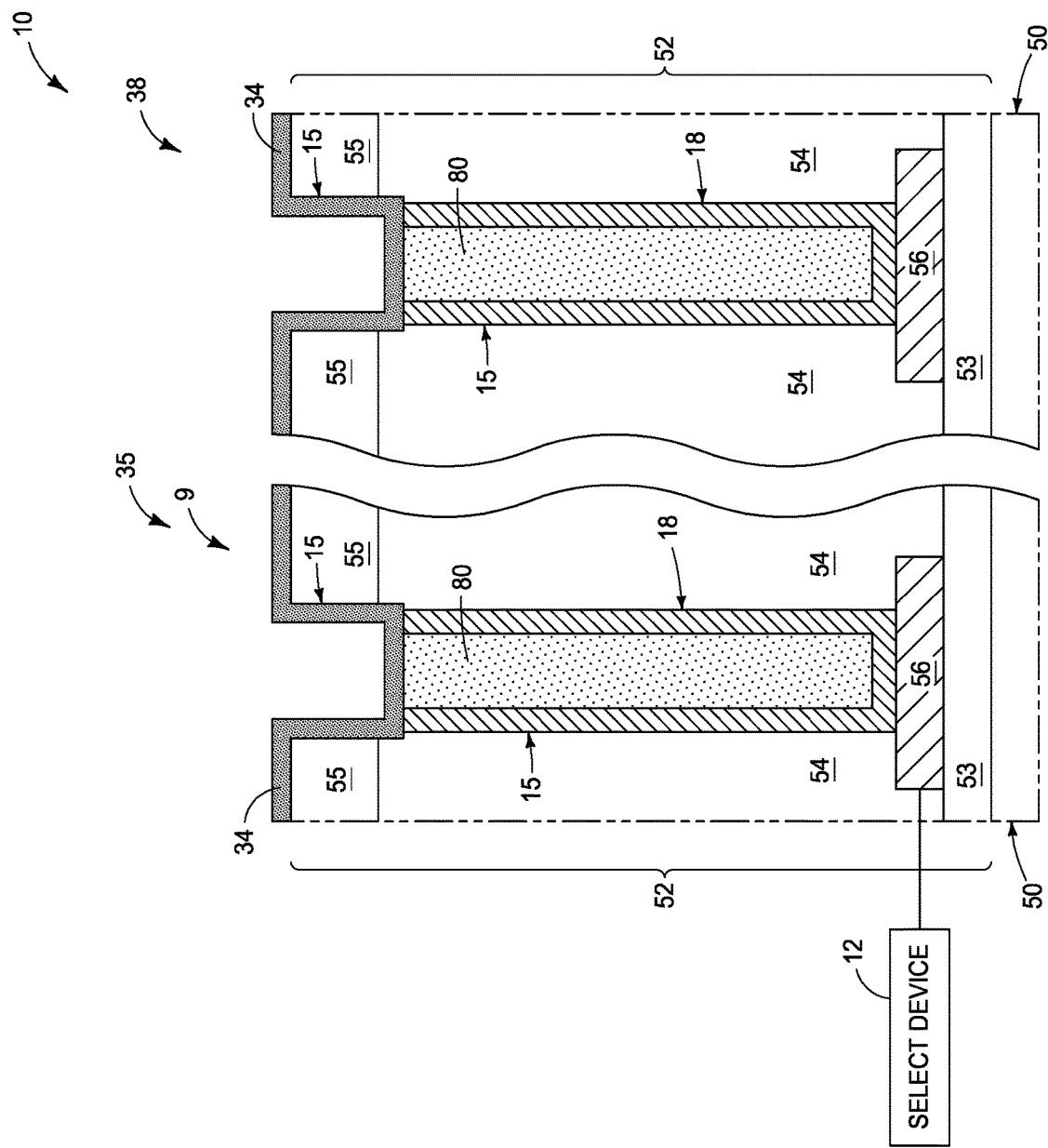

Referring to FIG. 10, a leaker-material lining 34 has been formed in capacitor openings 15 in first and second areas 35 and 38, respectively, atop conductive linings 18. In one embodiment and as shown, leaker-material lining 34 is also formed atop (e.g., directly against) sacrificial material 80.

Figure 11:
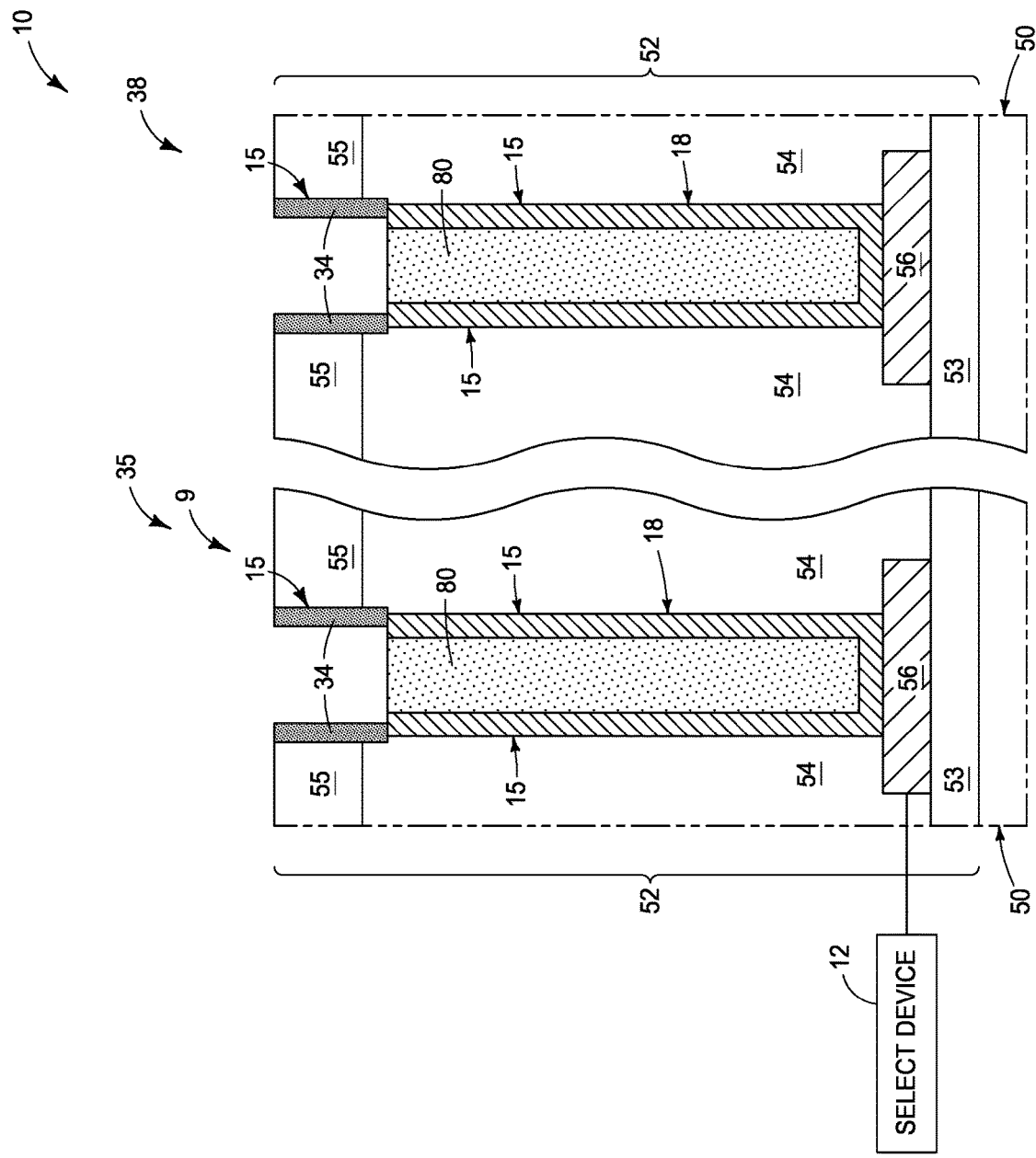

Referring to FIG. 11, leaker-material linings 34 have been anisotropically etched to largely remove such from being over horizontal surfaces, including in one embodiment from being atop sacrificial material 80.

Figure 12:
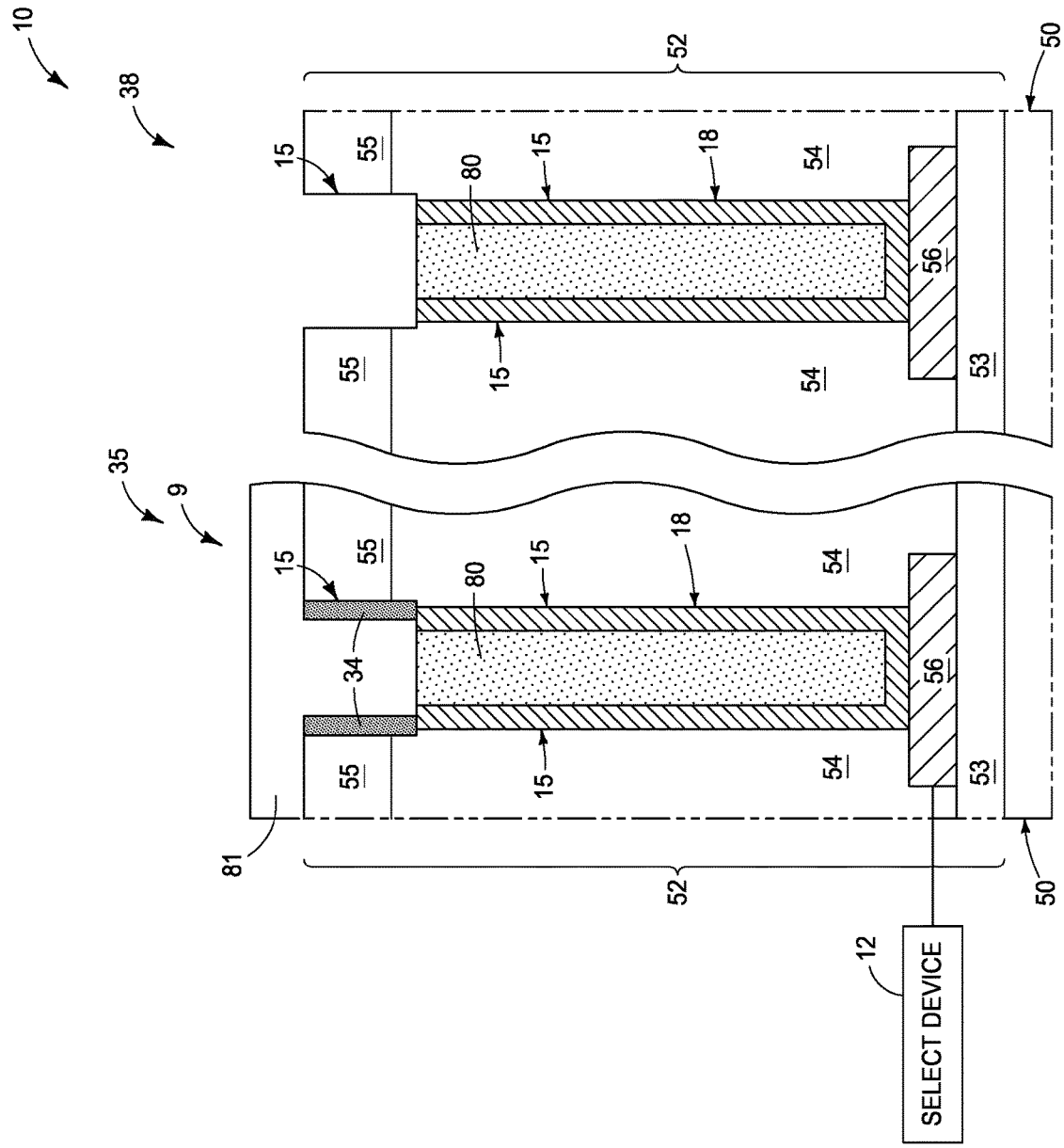
Figure 13:
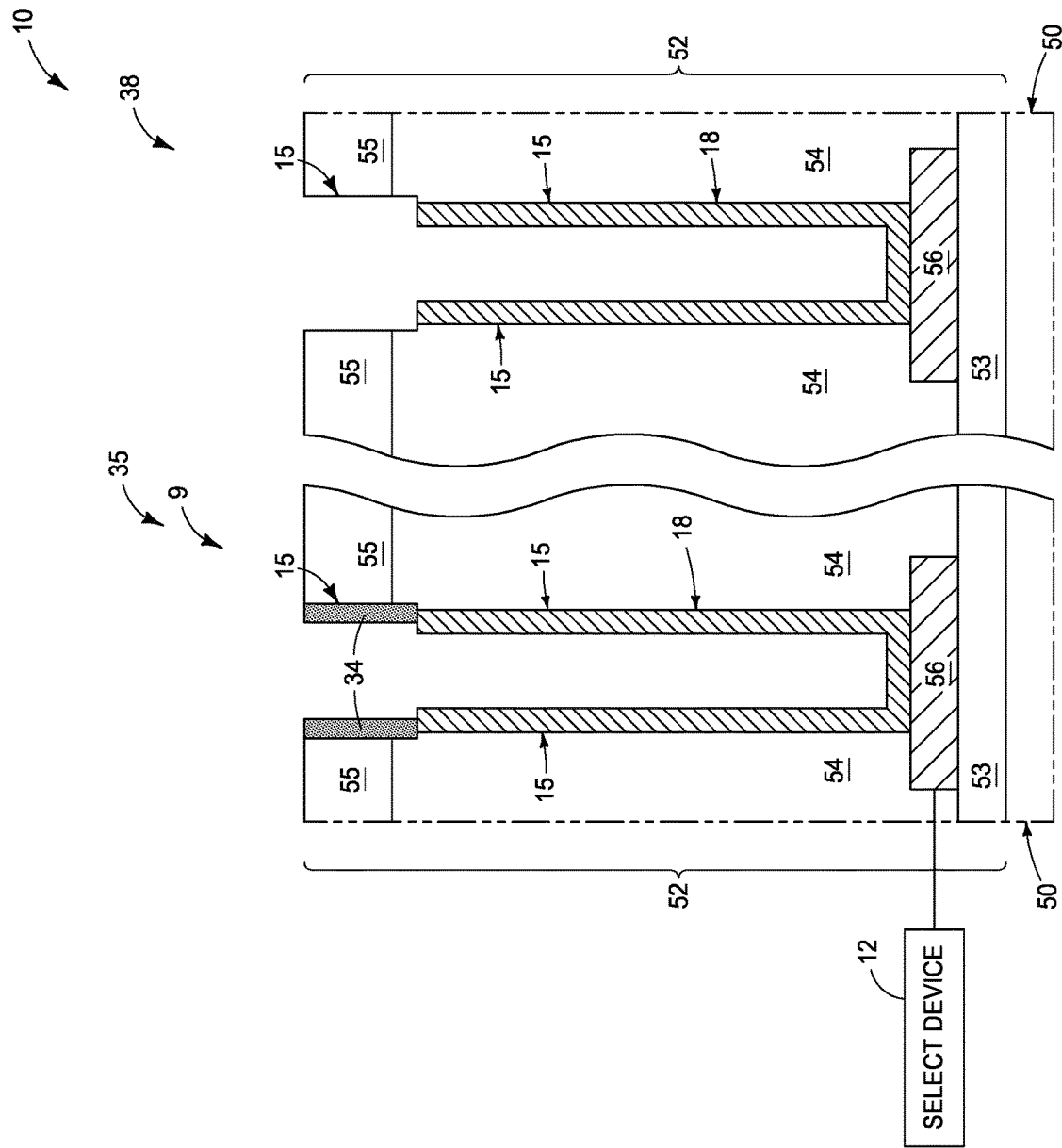

The leaker-material linings are removed from the capacitor openings in the second area to leave the leaker-material linings in the capacitor openings in the first area. An example technique for doing so is shown and described with reference to FIGS. 12 and 13. Referring to FIG. 12, masking material 81 (e.g., photoresist) has been formed to mask materials in capacitor openings 15 in first area 35 and to leave materials in capacitor openings 15 unmasked in second area 38, with leaker-material linings 34 being shown as having thereafter been removed from capacitor openings 15 in second area 38. FIG. 13 shows subsequent processing wherein masking material 81 (not shown) has been removed, followed by removing of remaining sacrificial material 80 (not shown) from being laterally-inward of conductive linings 18 in capacitor openings 15 in first and second areas 35 and 38, respectively.

Figure 14:
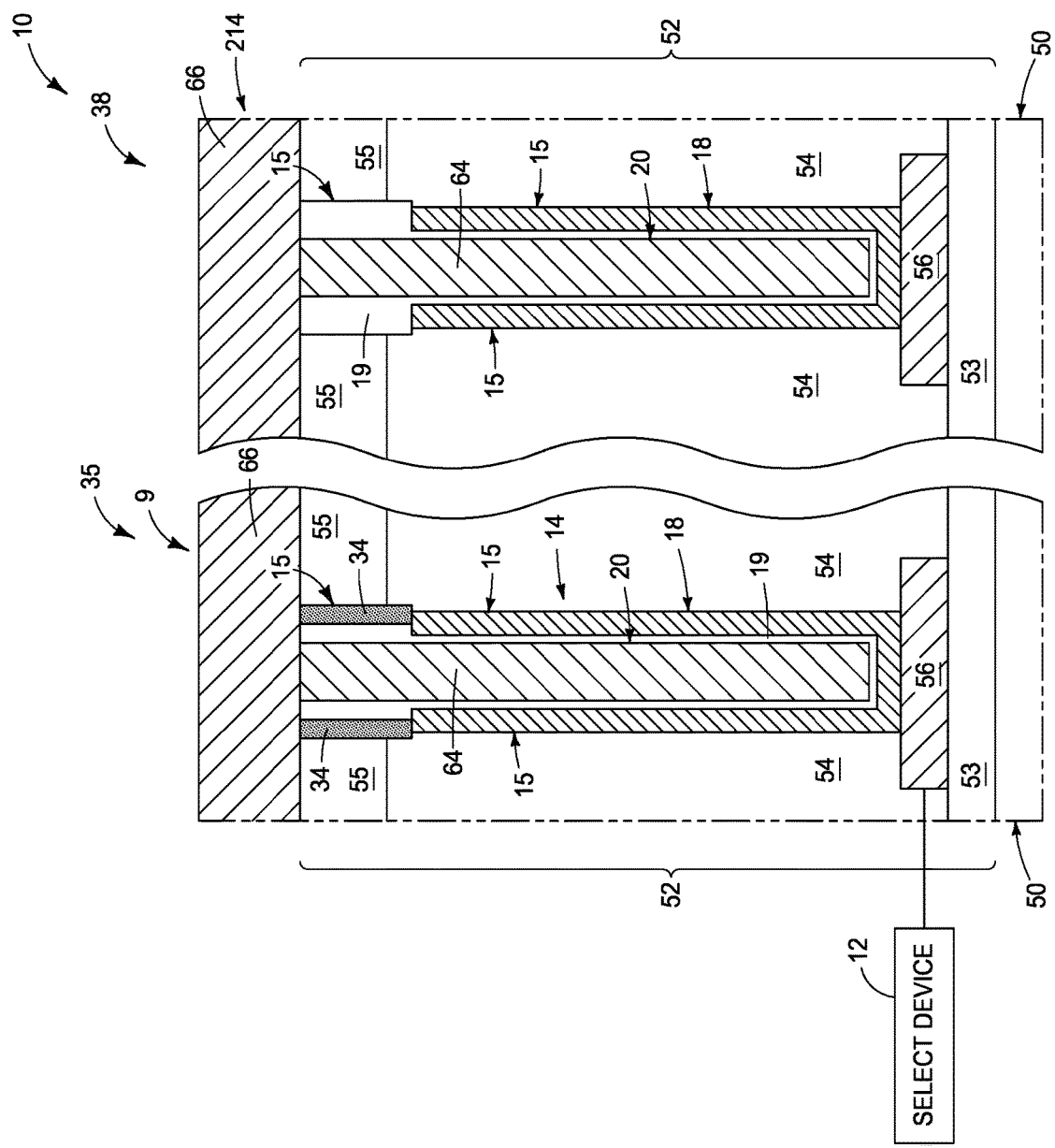

Referring to FIG. 14, capacitor insulator material 19 has been formed in capacitor openings 15 in first and second areas 35 and 38, respectively, aside conductive linings 18 and leaker-material linings 34 (where present). Such may result in capacitor insulator material 19 being wider atop conductive linings 18 than laterally there-between, as-shown. Thereafter, conductive materials 64 and 66 have been formed in first and second areas 35 and 38, respectively, to comprise second capacitor electrodes 20 of capacitors 14 and 214. Such forms slightly different construction capacitors 214 in second area 38 as compared to capacitors 14 in first area 35 due to absence of leaker material 34 in capacitors 214.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory cell comprises a capacitor comprising a first capacitor electrode having laterally-spaced walls, a second capacitor electrode comprising a portion above the first capacitor electrode, and capacitor insulator material between the second capacitor electrode and the first capacitor electrode. The capacitor comprises an intrinsic current leakage path from one of the first and second capacitor electrodes to the other through the capacitor insulator material. A parallel current leakage path is between the second capacitor electrode and the first capacitor electrode. The parallel current leakage path is circuit-parallel with the intrinsic current leakage path, of lower total resistance than the intrinsic current leakage path, and comprises leaker material that is everywhere laterally-outward of laterally-innermost surfaces of the laterally-spaced walls of the first capacitor electrode.

In some embodiments, a memory cell comprises a capacitor comprising a first capacitor electrode having laterally-spaced walls, a second capacitor electrode comprising a portion above the first capacitor electrode, and capacitor insulator material between the second capacitor electrode and the first capacitor electrode. The capacitor comprises an intrinsic current leakage path from one of the first and second capacitor electrodes to the other through the capacitor insulator material. A parallel current leakage path is between the second capacitor electrode and the first capacitor electrode. The parallel current leakage path is circuit-parallel with the intrinsic current leakage path, of lower total resistance than the intrinsic current leakage path, and comprises leaker material at least some of which is laterally-outward of laterally-outermost surfaces of the laterally-spaced walls of the first capacitor electrode.

In some embodiments, a memory cell comprises a capacitor comprising a first capacitor electrode having laterally-spaced walls, a second capacitor electrode comprising a portion above the first capacitor electrode, and capacitor insulator material between the second capacitor electrode and the first capacitor electrode. The capacitor comprises an intrinsic current leakage path from one of the first and second capacitor electrodes to the other through the capacitor insulator material. A parallel current leakage path is between the second capacitor electrode and the first capacitor electrode. The parallel current leakage path is circuit-parallel with the intrinsic current leakage path, of lower total resistance than the intrinsic current leakage path, and comprises leaker material that has maximum lateral thickness above individual of the laterally-spaced walls of the first capacitor electrode that is less than maximum lateral thickness of the capacitor insulator above the individual laterally-spaced walls of the first capacitor electrode.

In some embodiments, a memory cell comprises a capacitor comprising a first capacitor electrode having laterally-spaced walls that individually have a topmost surface, a second capacitor electrode comprising a portion above the first capacitor electrode, and capacitor insulator material between the second capacitor electrode and the first capacitor electrode. The capacitor comprises an intrinsic current leakage path from one of the first and second capacitor electrodes to the other through the capacitor insulator material. A parallel current leakage path is between the second capacitor electrode and the first capacitor electrode. The parallel current leakage path is circuit-parallel with the intrinsic current leakage path, of lower total resistance than the intrinsic current leakage path, and comprises leaker material that is directly above less than all of the topmost surfaces of the laterally-spaced walls of the first capacitor electrode.

In some embodiments, a memory cell comprises a capacitor comprising a first capacitor electrode (regardless of whether having laterally-spaced walls), a second capacitor electrode comprising a portion above the first capacitor electrode, and capacitor insulator material between the second capacitor electrode and the first capacitor electrode. The capacitor comprises an intrinsic current leakage path from one of the first and second capacitor electrodes to the other through the capacitor insulator material. A parallel current leakage path is between the second capacitor electrode and the first capacitor electrode. The parallel current leakage path is circuit-parallel with the intrinsic current leakage path, of lower total resistance than the intrinsic current leakage path, and comprises leaker material that is not directly above a topmost surface of the capacitor insulator material.

In some embodiments, a memory cell comprises a capacitor comprising a first capacitor electrode (regardless of whether having laterally-spaced walls), a second capacitor electrode comprising a portion above the first capacitor electrode, and capacitor insulator material between the second capacitor electrode and the first capacitor electrode. The capacitor comprises an intrinsic current leakage path from one of the first and second capacitor electrodes to the other through the capacitor insulator material. A parallel current leakage path is between the second capacitor electrode and the first capacitor electrode. The parallel current leakage path is circuit-parallel with the intrinsic current leakage path, of lower total resistance than the intrinsic current leakage path, and comprises leaker material that is not directly against any lateral sidewall surface of the second capacitor electrode.

In some embodiments, a method of forming a capacitor comprises forming a conductive lining in a capacitor opening in insulative-comprising material to comprise a first capacitor electrode of a capacitor being formed in the capacitor opening and forming sacrificial material laterally-inward of the conductive lining (regardless of forming more than one capacitor and regardless of first and second areas as describe above). The conductive lining and the sacrificial material are vertically recessed in the capacitor opening relative to a top surface of the insulative-comprising material immediately-laterally-adjacent the capacitor opening. A leaker-material lining is formed in the capacitor opening atop the conductive lining. After the leaker-material lining is formed, remaining of the sacrificial material is removed from being laterally-inward of the conductive lining in the capacitor opening. After removing the sacrificial material, capacitor insulator material is formed in the capacitor opening aside the conductive lining and the leaker-material lining. Conductive material is formed in the capacitor opening to comprise a second capacitor electrode of the capacitor. The capacitor comprises an intrinsic current leakage path from one of the first and second capacitor electrodes to the other through the capacitor insulator material. The leaker-material lining forms a parallel current leakage path that is circuit-parallel with the intrinsic current leakage path and of lower total resistance than the intrinsic current leakage path.

In some embodiments, a method of forming an array of capacitors comprises forming a conductive lining in individual capacitor openings in insulative-comprising material in first and second areas of a substrate to comprise first capacitor electrodes of capacitors being formed in the capacitor openings and forming sacrificial material laterally-inward of the conductive linings. The conductive linings and the sacrificial material are vertically recessed in the capacitor openings in the first and second areas relative to respective top surfaces of the insulative-comprising material immediately-laterally-adjacent the capacitor openings. A leaker-material lining is formed in the capacitor openings in the first and second areas atop the conductive linings. The leaker-material linings are removed from the capacitor openings in the second area to leave the leaker-material linings in the capacitor openings in the first area. After the leaker-material linings are removed from the second area, the remaining of the sacrificial material is removed from being laterally-inward of the conductive linings in the capacitor openings in the first and second areas. After removing the sacrificial material, capacitor insulator material is formed in the capacitor openings in the first and second areas aside the conductive linings and the leaker-material linings. Conductive material is formed in the capacitor openings in the first and second areas to comprise second capacitor electrodes of the capacitors. The capacitors individually comprise an intrinsic current leakage path from one of the first and second capacitor electrodes to the other through the capacitor insulator material. Individual of the leaker-material linings form a parallel current leakage path that is circuit-parallel with the intrinsic current leakage path and of lower total resistance than the intrinsic current leakage path.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell, comprising:
   a capacitor comprising:
      a first capacitor electrode having laterally-spaced walls;
      a second capacitor electrode comprising a portion above the first capacitor electrode; and
      capacitor insulator material between the second capacitor electrode and the first capacitor electrode, the capacitor comprising an intrinsic current leakage path from one of the first and second capacitor electrodes to the other through the capacitor insulator material; and
   a parallel current leakage path between the second capacitor electrode and the first capacitor electrode; the parallel current leakage path being circuit-parallel with the intrinsic current leakage path and being of lower total resistance than the intrinsic current leakage path, the parallel current leakage path being leaker material that is everywhere laterally-outward of laterally-innermost surfaces of the laterally-spaced walls of the first capacitor electrode and is nowhere laterally-inward of the laterally-innermost surfaces of the laterally-spaced walls of the first capacitor electrode.

2. The memory cell of claim 1 wherein the leaker material comprises an annulus.

3. The memory cell of claim 1 wherein the capacitor insulator material is ferroelectric.

4. A memory cell, comprising:
   a capacitor comprising:
      a first capacitor electrode having laterally-spaced walls;
      a second capacitor electrode comprising a portion above the first capacitor electrode; and
      capacitor insulator material between the second capacitor electrode and the first capacitor electrode, the capacitor comprising an intrinsic current leakage path from one of the first and second capacitor electrodes to the other through the capacitor insulator material;
   a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is everywhere laterally-outward of laterally-innermost surfaces of the laterally-spaced walls of the first capacitor electrode; and
   wherein the capacitor insulator material comprises laterally-spaced walls in a capacitor opening that are laterally thicker in the capacitor opening above the laterally-spaced walls of the first capacitor electrode than laterally-aside the laterally-spaced walls of the first capacitor electrode in the capacitor opening.

5. A memory cell, comprising:
   a capacitor comprising:
      a first capacitor electrode having laterally-spaced walls;
      a second capacitor electrode comprising a portion above the first capacitor electrode; and capacitor insulator material between the second capacitor electrode and the first capacitor electrode, the capacitor comprising an intrinsic current leakage path from one of the first and second capacitor electrodes to the other through the capacitor insulator material;

a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is everywhere laterally-outward of laterally-innermost surfaces of the laterally-spaced walls of the first capacitor electrode; and the leaker material comprises laterally-spaced walls in a capacitor opening that are laterally thinner in the capacitor opening than individual of the laterally-spaced walls of the first capacitor electrode in the capacitor opening.

6. A memory cell, comprising:

a capacitor comprising:

a first capacitor electrode having laterally-spaced walls;

a second capacitor electrode comprising a portion above the first capacitor electrode; and capacitor insulator material between the second capacitor electrode and the first capacitor electrode, the capacitor comprising an intrinsic current leakage path from one of the first and second capacitor electrodes to the other through the capacitor insulator material;

a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is everywhere laterally-outward of laterally-innermost surfaces of the laterally-spaced walls of the first capacitor electrode; and at least some of the leaker material is laterally-outward of laterally-outermost surfaces of the laterally-spaced walls of the first capacitor electrode.

7. A memory cell, comprising:

a capacitor comprising:

a first capacitor electrode having laterally-spaced walls;

a second capacitor electrode comprising a portion above the first capacitor electrode; and capacitor insulator material between the second capacitor electrode and the first capacitor electrode, the capacitor insulator material being directly above the laterally-spaced walls of the first capacitor electrode, the capacitor comprising an intrinsic current leakage path from one of the first and second capacitor electrodes to the other through the capacitor insulator material;

a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is everywhere laterally-outward of laterally-innermost surfaces of the laterally-spaced walls of the first capacitor electrode; and wherein the leaker material has maximum lateral thickness above individual of the laterally-spaced walls of the first capacitor electrode that is greater than maximum lateral thickness of the capacitor insulator material below topmost surfaces of the individual laterally-spaced walls of the first capacitor electrode.

8. A memory cell, comprising:

a capacitor comprising:

a first capacitor electrode having laterally-spaced walls;

a second capacitor electrode comprising a portion above the first capacitor electrode; and capacitor insulator material between the second capacitor electrode and the first capacitor electrode, the capacitor comprising an intrinsic current leakage path from one of the first and second capacitor electrodes to the other through the capacitor insulator material;

a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is everywhere laterally-outward of laterally-innermost surfaces of the laterally-spaced walls of the first capacitor electrode; and wherein the leaker material is directly above less than all of topmost surfaces of the laterally-spaced walls of the first capacitor electrode.

9. A memory cell, comprising:

a capacitor comprising:

a first capacitor electrode having laterally-spaced walls;

a second capacitor electrode comprising a portion above the first capacitor electrode; and capacitor insulator material between the second capacitor electrode and the first capacitor electrode, the capacitor comprising an intrinsic current leakage path from one of the first and second capacitor electrodes to the other through the capacitor insulator material;

a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is everywhere laterally-outward of laterally-innermost surfaces of the laterally-spaced walls of the first capacitor electrode; and the leaker material is not directly above a topmost surface of the capacitor insulator material.

10. A memory cell, comprising:

a capacitor comprising:

a first capacitor electrode having laterally-spaced walls;

a second capacitor electrode comprising a portion above the first capacitor electrode; and capacitor insulator material between the second capacitor electrode and the first capacitor electrode, the capacitor comprising an intrinsic current leakage path from one of the first and second capacitor electrodes to the other through the capacitor insulator material;

a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is everywhere laterally-outward of laterally-innermost surfaces of the laterally-spaced walls of the first capacitor electrode; and the leaker material is not directly against any lateral sidewall surface of the second capacitor electrode.

11. A memory cell, comprising:
a capacitor comprising:
a first capacitor electrode having laterally-spaced walls;
a second capacitor electrode comprising a portion above the first capacitor electrode; and
capacitor insulator material between the second capacitor electrode and the first capacitor electrode, the capacitor comprising an intrinsic current leakage path from one of the first and second capacitor electrodes to the other through the capacitor insulator material; and
a parallel current leakage path between the second capacitor electrode and the first capacitor electrode; the parallel current leakage path being circuit-parallel with the intrinsic current leakage path, of lower total resistance than the intrinsic current leakage path, and comprising leaker material at least some of which is laterally-outward of laterally-outermost surfaces of the laterally-spaced walls of the first capacitor electrode.

12. The memory cell of claim 11 wherein only some of the leaker material is laterally-outward of the laterally-outermost surfaces of the laterally-spaced walls of the first capacitor electrode.

13. A memory cell, comprising:
a capacitor comprising:
a first capacitor electrode having laterally-spaced walls;
a second capacitor electrode comprising a portion above the first capacitor electrode; and
capacitor insulator material between the second capacitor electrode and the first capacitor electrode, the capacitor comprising an intrinsic current leakage path from one of the first and second capacitor electrodes to the other through the capacitor insulator material; and
a parallel current leakage path between the second capacitor electrode and the first capacitor electrode; the parallel current leakage path being circuit-parallel with the intrinsic current leakage path, of lower total resistance than the intrinsic current leakage path, and comprising leaker material that has maximum lateral thickness directly above individual of the laterally-spaced walls of the first capacitor electrode that is greater than maximum lateral thickness of the capacitor insulator material directly above the individual laterally-spaced walls of the first capacitor electrode.

14. A memory cell, comprising:
a capacitor comprising:
a first capacitor electrode having laterally-spaced walls that individually have a topmost surface;
a second capacitor electrode comprising a portion above the first capacitor electrode; and
capacitor insulator material between the second capacitor electrode and the first capacitor electrode, the capacitor comprising an intrinsic current leakage path from one of the first and second capacitor electrodes to the other through the capacitor insulator material; and
a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is directly above less than all of the topmost surfaces of the laterally-spaced walls of the first capacitor electrode.

15. A memory cell, comprising:
a capacitor comprising:
a first capacitor electrode;
a second capacitor electrode comprising a portion above the first capacitor electrode; and
capacitor insulator material between the second capacitor electrode and the first capacitor electrode, the capacitor comprising an intrinsic current leakage path from one of the first and second capacitor electrodes to the other through the capacitor insulator material; and
a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is not directly above a topmost surface of the capacitor insulator material.

16. A memory cell, comprising:
a capacitor comprising:
a first capacitor electrode;
a second capacitor electrode comprising a portion above the first capacitor electrode; and
capacitor insulator material between the second capacitor electrode and the first capacitor electrode, the capacitor comprising an intrinsic current leakage path from one of the first and second capacitor electrodes to the other through the capacitor insulator material; and
a parallel current leakage path between the second capacitor electrode and the first capacitor electrode; the parallel current leakage path being circuit-parallel with the intrinsic current leakage path, of lower total resistance than the intrinsic current leakage path, and comprising leaker material that is not directly against any lateral sidewall surface of the second capacitor electrode.

* * * * *